(12) United States Patent
Iga et al.

(10) Patent No.: US 8,471,349 B2
(45) Date of Patent: Jun. 25, 2013

(54) PHOTORECEIVING DEVICE

(75) Inventors: Yukie Iga, Kawasaki (JP); Yasuhiro Yamauchi, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 293 days.

(21) Appl. No.: 13/004,519

(22) Filed: Jan. 11, 2011

(65) Prior Publication Data
US 2011/0186954 A1 Aug. 4, 2011

(30) Foreign Application Priority Data

Jan. 29, 2010 (JP) ................................ 2010-019651

(51) Int. Cl.
*H01L 31/02* (2006.01)
*H01L 31/024* (2006.01)

(52) U.S. Cl.
USPC 257/433; 257/459; 257/E31.11; 257/E31.131

(58) Field of Classification Search
USPC ................. 257/431, 448, 459, 723, 724, 728, 257/E21.499–E21.52, E31.11–E31.131; 438/56, 438/64–67
See application file for complete search history.

(56) References Cited

U.S. PATENT DOCUMENTS

| 5,252,852 A * | 10/1993 | Makiuchi et al. ............. 257/458 |
| 5,612,575 A | 3/1997 | De Givry |
| 2007/0177883 A1 | 8/2007 | Kagaya et al. |
| 2009/0256062 A1 | 10/2009 | Matsui |

FOREIGN PATENT DOCUMENTS

| CN | 101008695 A | 8/2007 |
| JP | 4-127545 | 4/1992 |
| JP | 8-274128 | 10/1996 |
| JP | 8-288453 | 11/1996 |
| JP | 2009-253207 | 10/2009 |

OTHER PUBLICATIONS

Chinese Office Action mailed Mar. 28, 2013 for corresponding Chinese Application No. 201110024011.X.

* cited by examiner

*Primary Examiner* — Julio J Maldonado
*Assistant Examiner* — Daniel Shook
(74) *Attorney, Agent, or Firm* — Staas & Halsey LLP

(57) ABSTRACT

The wiring arrangement length in a photoreceiving device is shortened. The photoreceiving device includes an amplifier for amplifying an output of the photoreceiving element and a photoreceiving element and they are mounted at a base member. A plurality of first bonding pads and a plurality of second bonding pads for connection to power supply are provided at both sides of a transmission path of an input or output signal of a photoreceiving element. Furthermore, at a position other than the parts arrangement surface of the base member, a plurality of first bonding pads are electrically connected to a plurality of second bonding pads.

18 Claims, 11 Drawing Sheets

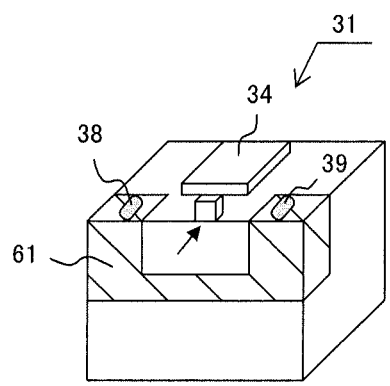
F I G. 8 A
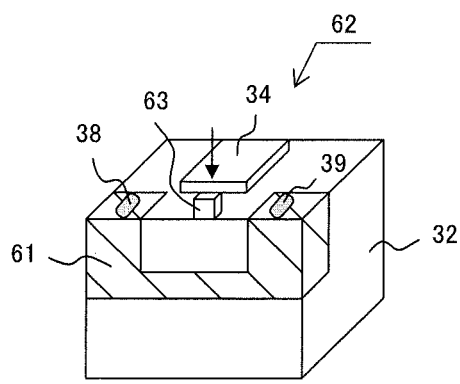
F I G. 8 B

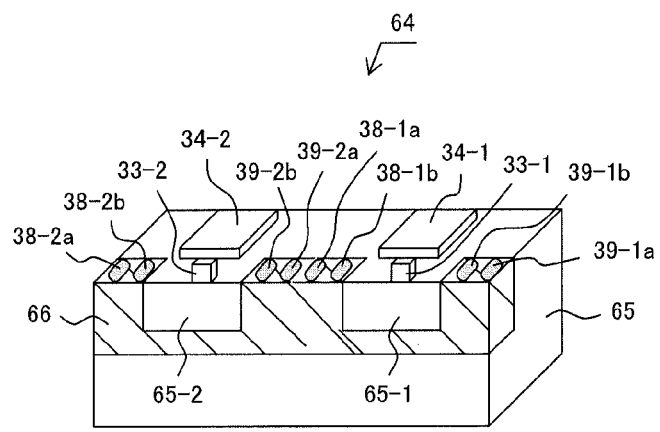
F I G. 9 A
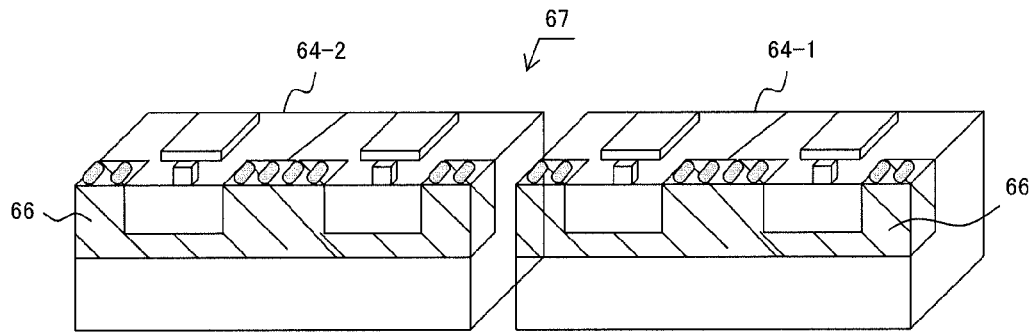
F I G. 9 B

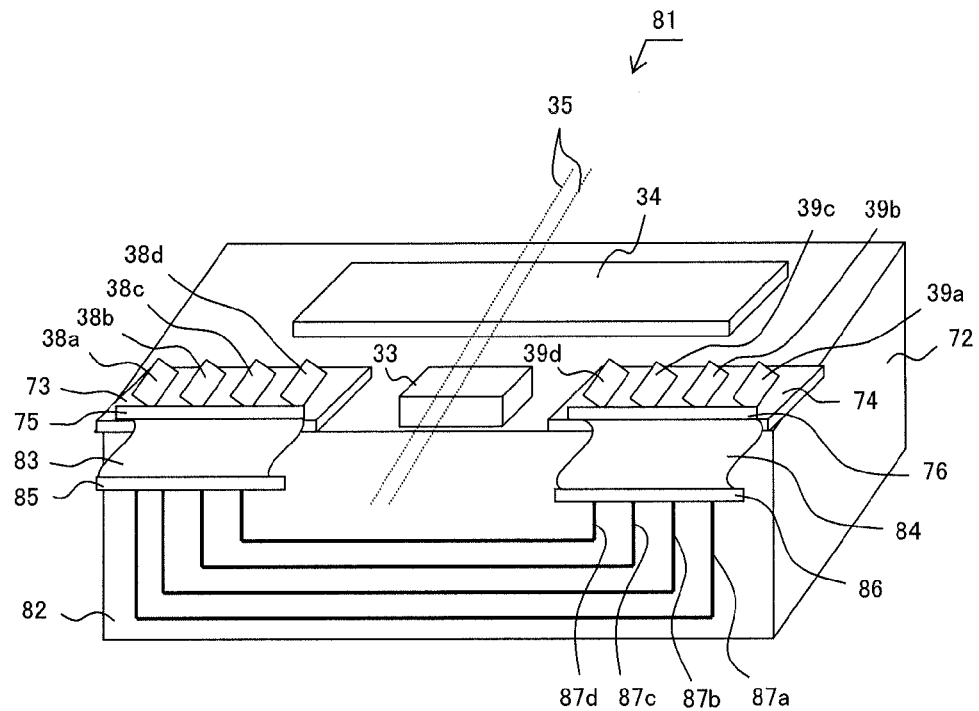
F I G. 1 1

PHOTORECEIVING DEVICE

CROSS-REFERENCE TO RELATED APPLICATIONS

This application is based upon and claims the benefit of priority of the prior Japanese Patent Application No. 2010-019651, filed on Jan. 29, 2010, the entire contents of which are incorporated herein by reference.

FIELD

The present invention relates to a photoreceiving device used in the optical communications.

BACKGROUND

An intensity modulating system and a phase modulating system are well known as two modulating systems in the optical communications. Two well known phase modulating systems are a method of performing a modulation by interference of a signal itself and a method of performing a modulation by interference of local light and a signal. The method of interference by a signal itself can be, for example, DPSK (differential phase shift keying) for performing a binary modulation and DQPSK (differential quadrature phase shift keying) for performing a quarternary modulation. The method of interference by local light and a signal can be DP-QPSK (dual polarization-quadrature phase shift keying) etc. for performing an octal modulation.

Conventionally, the following technique is well known as a wire bonding method for a semiconductor chip. Described is a semiconductor device in a multichip system storing a plurality of semiconductor chips in which a bonding pad is provided near one side of a second semiconductor chip loaded into a first semiconductor chip, and the bonding pad of the semiconductor chips is connected directly by a wire. Thus, the number of bonding pads of the substrate mounted with the semiconductor chips can be reduced, thereby realizing a small package (for example, cited document 1).

Described is an integrated circuit chip in which an output pad connected by a wire is arranged at a position other than the periphery of the upper surface. Along two edges on the upper surface of the integrated circuit chip, a wire bonding adapter having a bonding pad is arranged. The output pad at the center of the integrated circuit chip is connected to the bonding pad of one edge of the wire bonding adapter through a wire. Next, the bonding pad of another edge of the wire bonding adapter is connected to the pad of the substrate through the wire. Thus, even when an integrated circuit chip is laid on another integrated circuit chip, the wire bonding can be performed (for example, cited document 2).

In addition, described is a semiconductor integrated circuit device in which a built-in semiconductor chip is connected to a lead through wire bonding. In the device, a semiconductor chip is mounted at a wiring plate having a signal line for changing the connection path of the connecting pad of the semiconductor chip. Thus, any connecting pad of the semiconductor chip can be connected to any lead (for example, patent document 3).

A method of transmitting a signal at a high speed in the photoreceiving device for receiving an optical signal can be a method of performing the binary modulation using a high-speed optical element and a high-speed amplifier, and a method of performing a multivalued modulation using a low-speed optical element and a low-speed amplifier.

FIG. 1 is a schematic diagram of the structure of a photoreceiving device 10. A base member 11 is provided with a photoreceiving element 12 and an amplifier 13 for amplifying an output signal of the element. The photoreceiving device 10 is stored in a case, and power supply terminals 14 and 15 are provided at the left and right sides (as viewed from the front in FIG. 1) of the case.

The photoreceiving element 12 receives light from the front in FIG. 1 as indicated by the arrow in FIG. 1, and after an optical signal is converted into an electric signal, it is output backward after amplifying by the amplifier 13.

A plurality of terminals for connecting a power supply are provided for both sides of the amplifier 13. These power supply terminals are connected to power supply terminals 14 and 15 connected to an external power supply through a wire. In this case, since the power supply terminals 14 and 15 are provided for the left and right sides of the case, each wire can be connected to the power supply terminals 14 and 15 from the terminals at both sides of the amplifier 13.

FIG. 2 is a schematic diagram of the structure of a photoreceiving device 21 in which two photoreceiving devices 10a and 10b are stored in one case.

The photoreceiving device 10a includes a photoreceiving element 12a and an amplifier 13a. After the signal amplified by the amplifier 13a is output to a high frequency substrate 16, it is output to an external terminal not illustrated in the attached drawings.

The photoreceiving device 10b also includes a photoreceiving element 12b and an amplifier 13b. After the signal amplified by the amplifier 13b is output to a high frequency substrate 17, it is output to an external terminal not illustrated in the attached drawings.

Terminals for connecting a power supply are provided at both sides of the 13ab. Therefore, it is necessary to arrange the wires for connecting the terminal for connection of the power supply at the left side of the amplifier 13a to the power supply terminal 14 across the area above the amplifier 13a. Similarly, it is necessary to arrange the wires for connecting the terminal for connection of the power supply at the right side of the amplifier 13b to the power supply terminal 15 across the area above the amplifier 13b.

If the above-mentioned wiring arrangement is performed, the length of the wiring is long, and the inductance of the power supply line increases. The internal noise generated by an amplifier is the noise having nearly equal frequency to the main signal (for example, a signal of a frequency of 40 Gbps or more). When the inductance of the power supply line becomes high, the internal noise is reflected and returns to the amplifier and affects the main signal. Therefore, it is preferable that the wire is short.

Furthermore, when the wiring arrangement concentrates at one side of the amplifier 13, the distance between wires becomes short, and the stray capacitances become large, thereby causing the problem of crosstalk.

DOCUMENTS OF PRIOR ART

Patent Document

[Patent Document 1] Japanese Laid-open Patent Publication No. 8-288453
[Patent Document 2] Japanese Laid-open Patent Publication No. 8-274128
[Patent Document 3] Japanese Laid-open Patent Publication No. 4-127545

SUMMARY

The photoreceiving device disclosed by the present invention includes: an amplifier mounted at a base member and amplifying a photoreceiving element and output of the photoreceiving element; a plurality of first and second bonding pads for connection of a power supply arranged at both sides of a transmission path of an input or output signal of the photoreceiving element; and a connection member for electrically connecting the plurality of first bonding pads and the plurality of second bonding pads at a lower portion of a parts arrangement surface of the base member.

Another photoreceiving device includes: an amplifier loaded into a base member and amplifying a photoreceiving element and output of the photoreceiving element; a first wiring substrate arranged on one side of a transmission path of an input or output signal of the photoreceiving element on the parts arrangement surface of the base member and forming a plurality of first bonding pads for connection of a power supply; a second wiring substrate arranged on another side of a transmission path of an input or output signal of the photoreceiving element on the parts arrangement surface of the base member and forming a plurality of second bonding pads for connection of a power supply; and a connection member for electrically connecting the plurality of first bonding pads of the first wiring substrate to the plurality of second bonding pads of the second wiring substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed

BRIEF DESCRIPTION OF DRAWINGS

FIGS. 8A and 8B illustrate the structures of the photoreceiving device respectively of end surface incident type and surface incident type;

FIGS. 9A and 9B illustrate other structures of other photoreceiving devices;

FIG. 11 illustrates the structure of the photoreceiving device according to the fifth embodiment.

DESCRIPTION OF EMBODIMENTS

Figure 1:
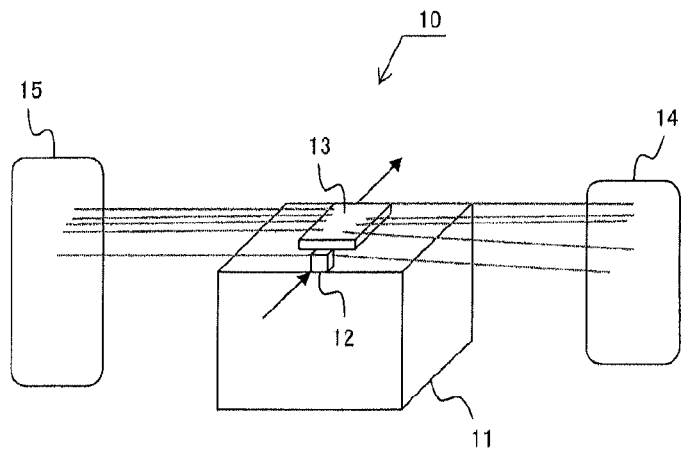
FIG. 1 illustrates the structure of a photoreceiving device.
Figure 2:
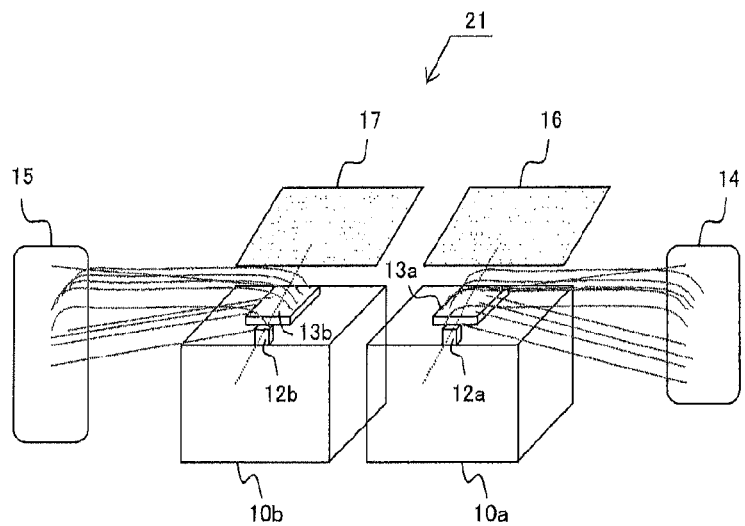
FIG. 2 illustrates the wiring state of the power supply line when two photoreceiving devices are included.
Figure 3:
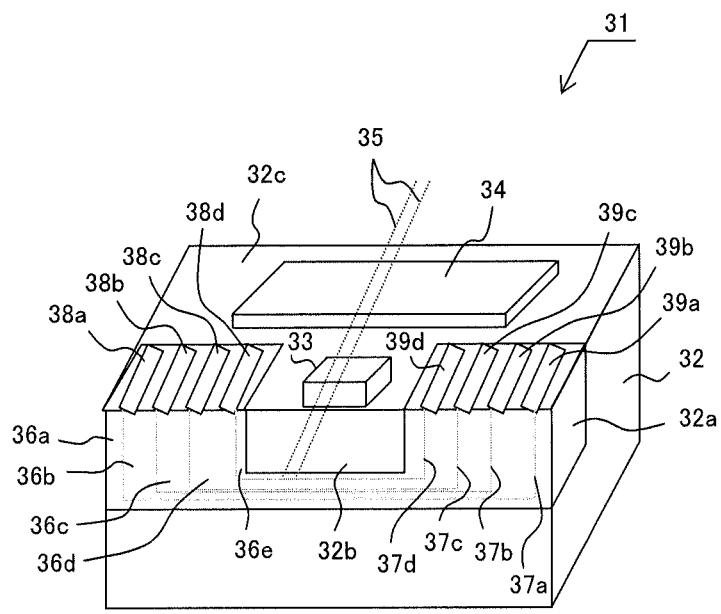
FIG. 3 illustrates the structure of the photoreceiving device according to the first embodiment.

FIG. 3 is a schematic diagram of the structure of a photoreceiving device 31 according to the first embodiment. For example, one or more photoreceiving devices 31 are stored in a case, wire-bonded to the power supply terminal of the case, and then tightly enclosed and used as a photoreceiving device (photoreceiving module).

Semiconductor chips of a photoreceiving element 33 and an amplifier 34 are provided at the top surface (parts arrangement surface) of a base member 32. The base member 32 is used for heat radiation from the photoreceiving element 33 and the amplifier 34. The base member 32 can be, for example, made of a thermal-conductive metal material such as Kovar etc. The base member 32 can be any thermal-conductive material other than metal.

The photoreceiving element 33 is, for example, a photoreceiving element of end surface incident type, converts the light entering from the front as viewed from the front in FIG. 3 into an electric signal, and outputs a conversion result to the amplifier 34. The amplifier 34 amplifies the output signal of the photoreceiving element 33. Two dotted line 35 entering the photoreceiving element 33 from the front as viewed from the front in FIG. 3 and output from the amplifier 34 indicates the transmission path of the main signal (the optical signal input to the photoreceiving element 33 or the output signal). The optical signal is light of, for example, 40 Gbps or more.

The section of the base member 32 is ⌐-shaped at a part of the top surface and sides. In a ⌐-shaped notch portion 32a, a plurality of sheets 36a through 36e (sheet members, for example, green sheets) are laid and inserted. The base member 32 are cut in ⌐-shape so that a convex portion 32b can be provided at the lower part of the photoreceiving element 33 and the heat radiation can be sufficiently performed for the photoreceiving element 33.

The sheets 36a through 36e are sheets of insulating members such as thin ceramics etc. Conductor patterns 37a through 37d are formed at one surface of each of the sheets 36a through 36d. The sheets 36a through 36e are made of a material of thermal conductivity and insulation such as alumina etc. The method of forming the conductor patterns 37a through 37d can be a method of applying, printing, evaporation, plating, etc. of electroconductive paste. FIG. 3 illustrates different thicknesses of the sheets 36a through 36d, but they are practically of the same thickness.

Bonding pads 38a through 38d and bonding pads 39a through 39d for connection to power supply are provided at both sides of the dotted line 35 through which a main signal is transmitted. The bonding pads 38a through 38d for connection to power supply (for example, corresponding to the first bonding pad) are electrically connected respectively to the conductor patterns 37a through 37d. The bonding pads 39a through 39d (for example, corresponding to the second bonding pad) are also electrically connected to the conductor patterns 37a through 37d. That is, the bonding pads 38a through 38d and the bonding pads 39a through 39d are electrically connected at the lower portion at the parts arrangement surface through the conductor patterns 37a through 37d of the sheets 36a through 36d.

For example, when the bonding pads 38a through 38d and 39a through 39d are provided at both end portions of the sheets 36a through 36d, the bonding pads 38a through 38d and 39a through 39d are electrically connected to the end portions of the conductor patterns 37a through 37d. Otherwise, a through hole is formed in the sheets 36a through 36d to electrically connect the bonding pads 38a through 38d and 39a through 39d to the conductor patterns 37a through 37d. Other connecting methods are available.

Thus, the bonding pads 39a through 39d on the right and the bonding pads 38a through 38d on the left as viewed from the front in FIG. 3 are electrically connected to one another by the conductor patterns 37a through 37d formed at the sheets 36a through 36d.

Therefore, the connection between the power supply terminal (not illustrated in the attached drawings) on the left and right sides (left and right sides centering the transmission path 35 of the main signal) of the amplifier 34 and the power supply terminal on the right side of the case can be made using the bonding pads 38a through 38d and 39a through 39d. Thus, since it is not necessary to make the wiring arrangement across the area above the amplifier 34, the wiring arrangement length of the power supply line (wiring arrangement for power supply) of the amplifier 34 can be reduced. Therefore, the inductance of a power supply line can be reduced, thereby minimizing the distortion of a signal waveform. The wiring of the power supply line is described later in detail.

Figure 4A:
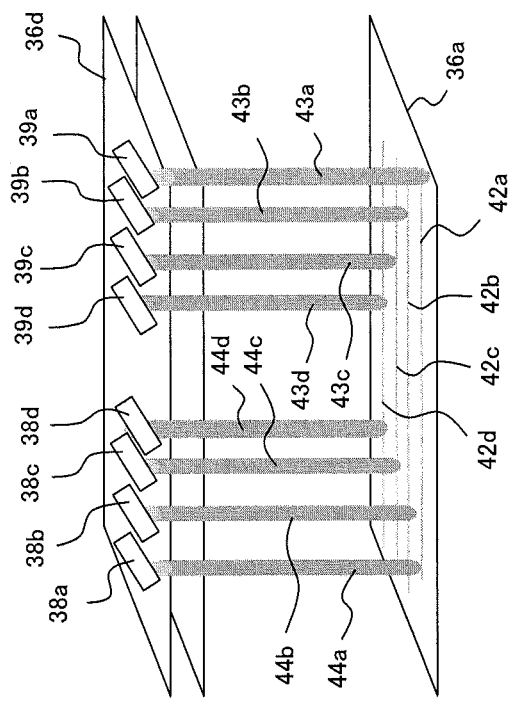
FIGS. 4A and 4B illustrate the structures of the photoreceiving device according to the second embodiment.
Figure 4B:
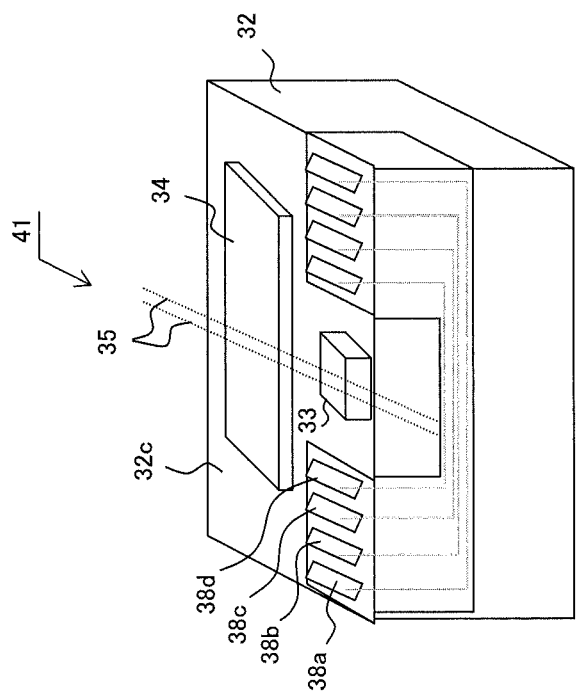

FIGS. 4A and 4B are schematic diagrams of the structures of a photoreceiving device 41 according to the second embodiment.

FIG. 4A illustrates the entire structure of the photoreceiving device 41. FIG. 4B illustrates the structure of connecting the bonding pad for connection to power supply to the conductor pattern formed at the sheet.

The structure of the photoreceiving device 41 according to the second embodiment is basically the same as the structure of the photoreceiving device 31 illustrated in FIG. 3. The difference from the structure illustrated in FIG. 3 is that a conductor pattern for connection to a plurality of bonding pads is formed at one sheet, and connected through a through hole. In FIG. 4, the same components as those illustrated in FIG. 3 are assigned the same reference numerals, and the detailed descriptions are omitted here.

On the sheet 36a arranged at the bottom, four conductor patterns 42a through 42d for connection of the bonding pads 38a through 38d to the bonding pads 39a through 39d, which are four sets of bonding pads for connection to power supply. Through holes 43a through 43d and 44a through 44d are formed at preferable positions of the sheets 36a through 36d. Then, the bonding pads 38a through 38d and 39a through 39d for connection to power supply are formed at the top sheet 36d (or an insulating layer), thus electrically connecting to the through holes 43a through 43d and 44a through 44d. Thus, the conductor patterns 42a through 42d corresponding to the bonding pads 38a through 38d and 39a through 39d can be electrically connected.

By forming the through holes 43a through 43d and 44a through 44d in the sheets 36a through 36d, the right bonding pads 39a through 39d for connection to power supply in FIG. 4B can be electrically connected to the left corresponding bonding pads 38a through 38d.

In the example above, four conductor patterns 42a through 42d are formed at one sheet 36a, but a part of the conductor patterns 42a through 42d can be divided and formed at two or more sheets. Otherwise, a conductor pattern can be formed at each of the sheets 36a through 36d. In this case, a through hole is to be formed for connection of a bonding pad corresponding to the conductor pattern in each layer.

Figure 5:
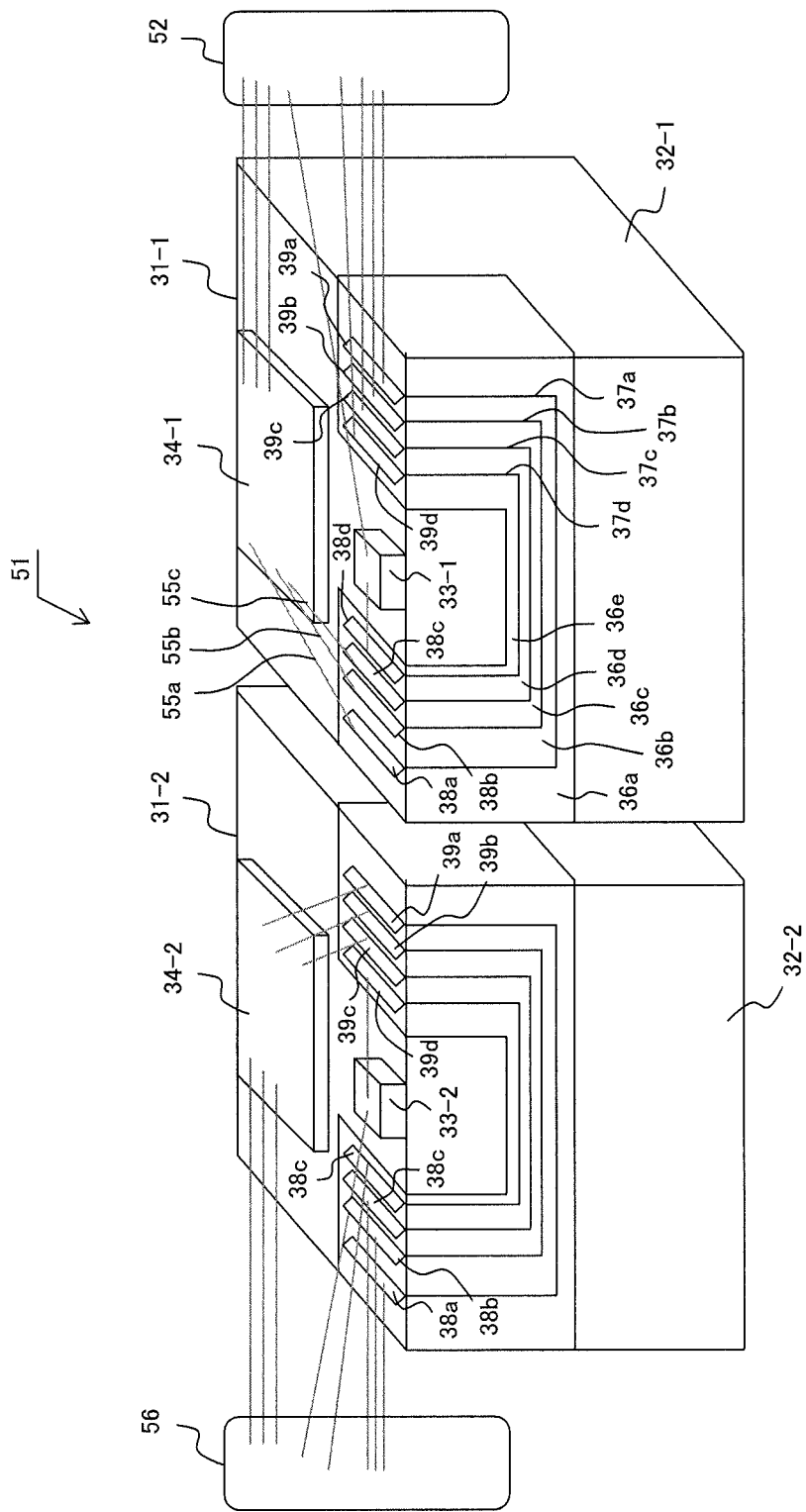
FIG. 5 illustrates the wiring state of the power supply line of the photoreceiving device according to the third embodiment.
Figure 6:
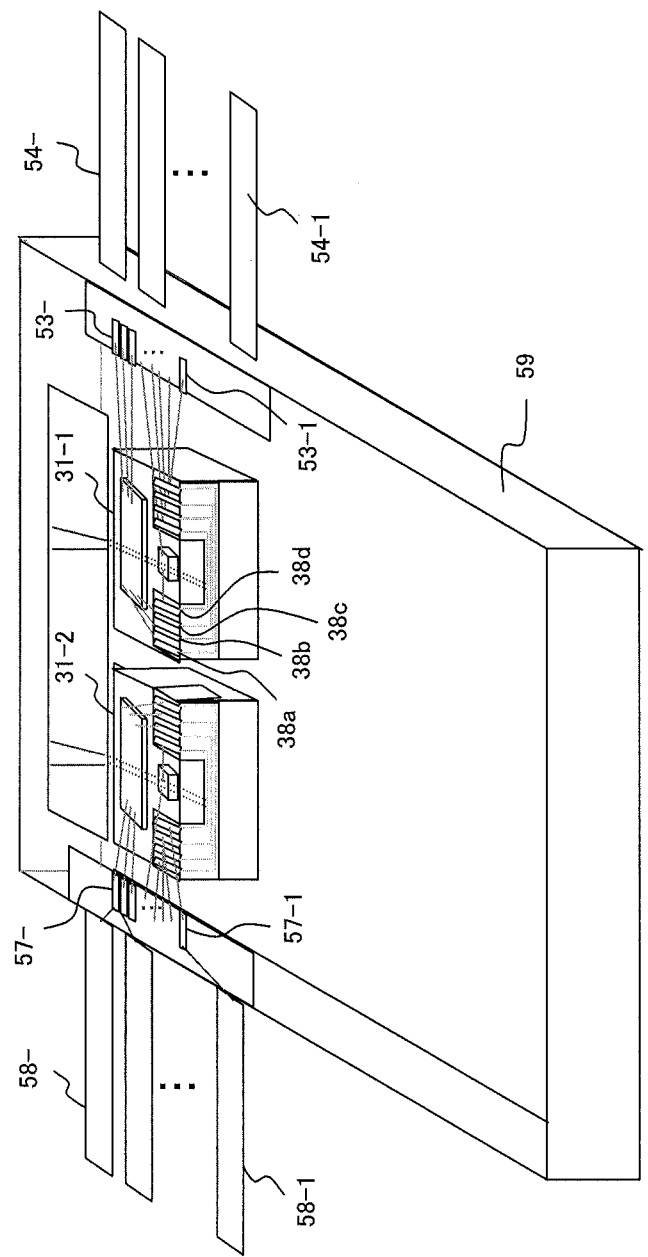
FIG. 6 illustrates the inside of the case of the photoreceiving device according to the third embodiment.

FIG. 5 is a schematic diagram illustrating the wiring state of the power supply line (wiring arrangement for power supply) of a photoreceiving device 51 according to the third embodiment. FIG. 6 illustrates the inside of a case 59 of the photoreceiving device 51 according to the third embodiment.

The photoreceiving device 51 has the case 59 storing two photoreceiving devices 31-1 and 31-2. The structure of the photoreceiving devices 31-1 and 31-2 is the same as the structure of the photoreceiving device 31 in FIG. 3. In the following descriptions, the same components as in FIG. 3 are assigned the same reference numerals, and the detailed descriptions are omitted here.

As viewed from the front in FIG. 5, the right photoreceiving device 31-1 is provided with bonding pads 38a through 38d for connection to power supply and bonding pads 39a through 39d for connection to power supply at both sides of the transmission path of a main signal, for example, to the right and left of a photoreceiving element 33-1. The bonding pads 38a through 38d and 39a through 39d are electrically connected by the conductor patterns 37a through 37d whose corresponding pads are formed at the sheets 36a through 36d. Practically, the outermost bonding pad 39a on the right and the outermost bonding pad 38a on the left are connected by the conductor pattern 37a. Similarly, the second bonding pad 39b on the right and the second bonding pad 38b on the left are connected by the 37b. Likewise, other bonding pads are similarly connected by a corresponding conductor pattern.

In FIG. 5, when a conductor pattern is connected using a through hole, the portions illustrated as the conductor patterns 37a through 37d extending perpendicularly downward from the bonding pads 38a through 38d and 39a through 39d correspond to through holes. The lower horizontal line corresponds to a conductor pattern.

The wiring of the power supply lines of the photoreceiving devices 31-1 and 31-2 is described below with reference to FIGS. 5 and 6.

As described above, the bonding pads 38a through 38d of the photoreceiving device 31-1 are electrically connected respective to the corresponding bonding pads 39a through 39d by the conductor patterns 37a through 37d formed at one surface of the sheets 36a through 36d.

The bonding pads 39a through 39d for connection to power supply are wire-bonded to a power supply terminal 52 of the case connected to a plurality of external power supply units. In FIG. 5, the power supply terminal 52 is illustrated as one member, but practically the power supply terminals 52 and 56 to the left and right of the case 59 are provided with n independent pads 53-1 through 53-n and 57-1 through 57-n for connection as illustrated in FIG. 6. Then, the connection terminals 54-1 through 54-n and 58-1 through 58-n are exposed outside the case 59 respectively from the pads 53-1 through 53-n and 57-1 through 57-n.

A plurality of power supply terminals (not illustrated in the attached drawings) are provided at the left and right (as viewed from the front in FIG. 5) sides of the top surface of an amplifier 34-1 of the photoreceiving device 31-1. Then, a plurality of power supply terminals of the right side of the amplifier 34-1 are wire-bonded to the power supply terminal 52.

Three power supply terminals (not illustrated in the attached drawings) of the left side of the amplifier 34-1 are wire-bonded respectively to the three bonding pads 38a through 38c for connection to power supply. The power supply terminal of the photoreceiving element 33-1 is wire-bonded to the bonding pad 38d for connection to power supply.

For example, the top power supply terminal of the left side of the amplifier 34-1 is connected to the bonding pad 38a by a power supply line 55a. The second power supply terminal of the left side of the amplifier 34-1 is connected to the bonding pad 38b by a power supply line 55b. Furthermore, the third power supply terminal of the left side of the amplifier 34-1 is connected to the bonding pad 38c by a power supply line 55c.

That is, the wiring arrangement between the power supply terminal at the left side of the amplifier 34-1 and the power supply terminal at the right of the case can be performed without passing across the area above the amplifier 34-1 by providing the bonding pads 38a through 38d and 39a through 39d for connection to power supply at the left and right of the transmission path of a main signal. Thus, the wiring arrangement length of the power supply line can be minimized.

The same holds true with the photoreceiving device 31-2 at the left. The bonding pads 38a through 38d of the photoreceiving device 31-2 are respectively electrically connected to the corresponding bonding pads 39a through 39d by the conductor patterns 37a through 37d formed at one surface of the sheets 36a through 36d.

The bonding pads 39a through 39d for connection to power supply are wire-bonded to the power supply terminal 56 to which different power supply voltages are externally provided. The power supply terminal 56 in FIG. 5 is practically provided with n independent pads 57-1 through 57-n as illustrated in FIG. 6.

The left and right (viewed from the front in FIG. 5) sides of an amplifier 34-2 of the photoreceiving device 31-2 are provided with a plurality of power supply terminals (not illustrated in the attached drawings). Then, the plurality of power supply terminals at the left side of the amplifier 34-2 are wire-bonded to the power supply terminal 56 at the left side of the case.

Three power supply terminals (not illustrated in the attached drawings) at the right side of the amplifier 34-2 are respectively wire-bonded to three bonding pads 39a through 39c for connection to power supply. In addition, the power supply terminal of a photoreceiving element 33-2 is wire-bonded to a bonding pad 39d for connection to power supply.

That is, the power supply terminal at the right side of the amplifier 34-2 can be wire-bonded to the bonding pads 39a through 39d by providing the bonding pads 38a through 38d and 39a through 39d for connection to power supply. Thus, when the power supply terminal at the right side of the amplifier 34-2 is connected to the power supply terminal 56 at the left side of the case through a wire, the wiring of a power supply line can be performed without passing across the area above the amplifier 34-2.

According to the third embodiment above, the wiring of the power supply line of the amplifiers 34-1 and 34-2 mounted at the two photoreceiving devices 31-1 and 31-2 can be shortened by performing the wiring using the bonding pads 38a through 38d. Thus, since the inductance of the power supply line can be reduced, the reflection etc. on the power supply line of the internal noise of the amplifiers 34-1 and 34-2 can be reduced, thereby improving the anti-noise property. In addition, since it is not necessary to pass across the area above the amplifiers 34-1 and 34-2, the number of power supply lines which pass through one side of the amplifiers 34-1 and 34-2 can be reduced, thereby sufficiently reserving the interline distance. Thus, the stray capacitances of the power supply line can be reduced, and the crosstalk of signals can also be reduced.

Figure 7A:
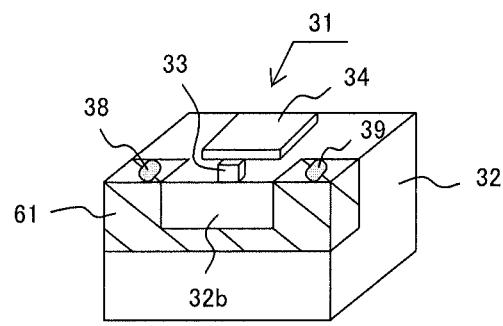
FIGS. 7A and 7B are examples of the structure of the photoreceiving device.
Figure 7B:
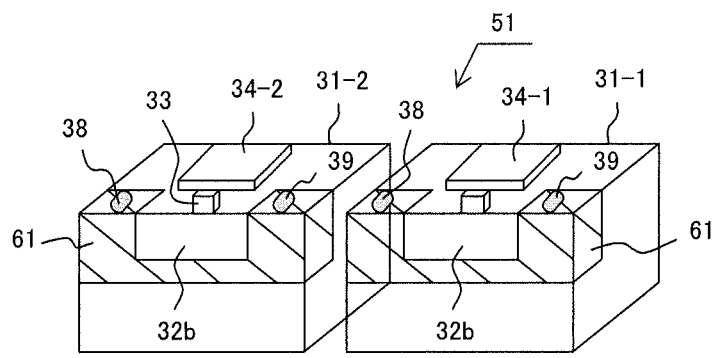

FIGS. 7A and 7B are examples of the structure of the photoreceiving device. FIG. 7A is an example of a case in which one photoreceiving device 31 is stored in a case. FIG. 7B is an example of a case in which two photoreceiving devices are stored in a case.

In a diagonally shaded area 61 of the photoreceiving device 31 (or 31-1 and 31-2) illustrated in FIGS. 7A and 7B, the sheets 36a through 36d on which a conductor pattern is formed at one side and the top sheet 36e at which no conductor pattern is formed are laid and stored. In other drawings described below, the entire laid sheets 36a through 36e are indicated by the diagonally shaded area 61.

The section of the base member 32 is U-shaped so that the lower portion of the photoreceiving element 33 can be convex. Therefore, the sheets 36a through 36e (the entire sheets are hereinafter referred to as a sheet 36) are stored to bypass the convex portion 32b of the base member 32.

On both sides enclosing the photoreceiving element 33 at the top surface of the base member 32, a plurality of bonding pads 38 for connection to power supply and a plurality of bonding pads 39 are provided. Hereafter, the entire bonding pads 38a through 38d in FIG. 3 are referred to as a bonding pad 39. The bonding pad 39 and the bonding pad 38 are electrically connected by the sheet 36.

FIGS. 8A and 8B illustrate the structures of the photoreceiving device respectively of end surface incident type and surface incident type.

FIG. 8A illustrates the structure of the photoreceiving device 31 having a photoreceiving element of end surface incident type. The structure of the photoreceiving device 31 of end surface incident type is the same as that in FIG. 3.

FIG. 8B illustrates the structure of a photoreceiving device 62 having a photoreceiving element 63 of surface incident type. The photoreceiving element 63 receives light perpendicularly downward from above the base member 32.

In this case, the structures of the bonding pads 38 and 39 for connection to power supply and the sheet 36 for electrically connecting the bonding pads are the same as those in FIG. 3.

FIGS. 9A and 9B illustrate other structures of other photoreceiving devices. FIG. 9A illustrates the structure of a photoreceiving device 64 in which two photoreceiving elements 33-1 and 33-2 and two amplifiers 34-1 and 34-2 are mounted at the same base member.

The photoreceiving device 64 in FIG. 9A has two photoreceiving elements 33-1 and 33-2 and two amplifiers 34-1 and 34-2 mounted at the top surface of the same base member 65. A notch portion (portion indicated by diagonal lines in FIG. 9A) 66 having the E-shaped section is formed to keep convex portions 65-1 and 65-2 for heat radiation at the lower portion of the photoreceiving elements 33-1 and 33-2. One or two sets of lais sheets 36a and 36b are inserted into the notch portion 66 although not illustrated in FIG. 9A.

Bonding pads 38-1a through 38-1b and 39-1a through 39-1b and bonding pads 38-2a through 38-2b and 39-2a through 39-2b for connection to power supply are provided at the top surface (or insulating layer) of the sheet 36a or 36b. Although FIG. 9A illustrates two bonding pads 38-1a through 38-1b for simple explanation, three or more bonding pads can be provided.

For example, when one set of sheets 36a and 36b is to be inserted into the E-shaped notch portion 66, a plurality of conductor patterns are formed at one or plural sheets in one set of sheets 36a and 36b. Then, a through hole is formed at the position corresponding to the bonding pads of the sheets 36a and 36b. By the through hole and the conductor pattern, a set of bonding pads 38-1a through 38-1b and the bonding pads 39-1a through 39-1b on the right (viewed from the front in FIG. 9A) are electrically connected. Similarly, by the through hole and the conductor pattern, bonding pads 38-2a through 38-2b and bonding pads 39-2a through 39-2b on the left are connected. In this case, one set of sheets 36a and 36b electrically connects two sets of bonding pads.

When two sets of first and second sheets 36a and 36b are inserted into the E-shaped notch portion 66, a through hole is formed for each of the two sets of sheets. The right bonding pads 38-1a through 38-1b and the bonding pads 39-1a through 39-1b are electrically connected by the through hole of the first sheet and the conductor pattern. The left bonding pads 38-2a through 38-2b and the bonding pads 39-2a through 39-2b are also electrically connected by the through hole of the second sheet and the conductor pattern. In this case, the conductor pattern and the bonding pad can be connected not by a through hole, but by the end portions of the first and second sheet.

The photoreceiving device 64 having the above-mentioned structure can acquire the same effect as the photoreceiving device 51 storing two photoreceiving devices 31-1 and 31-2 illustrated in FIG. 6. That is, the wiring arrangement length of a power supply line can be shortened by wire bonding the power supply terminal on the left side of the amplifier 34-1 to the bonding pads 38-1a through 38-1b. Similarly, the wiring arrangement length of a power supply line can be shortened by wire bonding the power supply terminal on the right side of the amplifier 34-2 to the bonding pads 39-2a through 39-2b. Thus, the distortion of a signal waveform by the inductance of a power supply line can be reduced. In addition, since it is not necessary to arrange a power supply line across the area above the amplifiers 34-1 and 34-2, the number of power supply lines concentrating on one side of the amplifiers 34-1 and 34-2 can be reduced, thereby sufficiently reserving the inter-line distance. Thus, the stray capacitances of a power supply line and the crosstalk of a signal can be reduced.

Furthermore, since two sets of photoreceiving elements 33-1 and 33-2 and amplifiers 34-1 and 34-2 are mounted at the same base member 65, the case of the photoreceiving device can be smaller, and the necessary cost can be reduced.

FIG. 9B illustrates the internal structure when two photoreceiving devices 64 illustrated in FIG. 9A are to be stored in one case.

A photoreceiving device 67 includes two photoreceiving devices 64-1 and 64-2 having on the same base member two photoreceiving elements 33-1 and 33-2 and two amplifiers 34-1 and 34-2.

The photoreceiving device 67 can acquire the same effect as the photoreceiving device 64 illustrated in FIG. 9A. That is, since the wiring arrangement length of a power supply line connected to the power supply terminals of the amplifiers 34-1 and 34-2 can be shortened, the distortion of the signal waveform by the inductance of a power supply line can be reduced. In addition, since it is not necessary to wire a power supply line across the area above the amplifiers 34-1 and 34-2, the number of wires concentrating on one side of the amplifiers 34-1 and 34-2 can be reduced, and the inter-line distance of the power supply lines can be sufficiently reserved. Thus, the stray capacitances of a power supply line can be reduced, and the crosstalk of a signal can be reduced.

Figure 10:
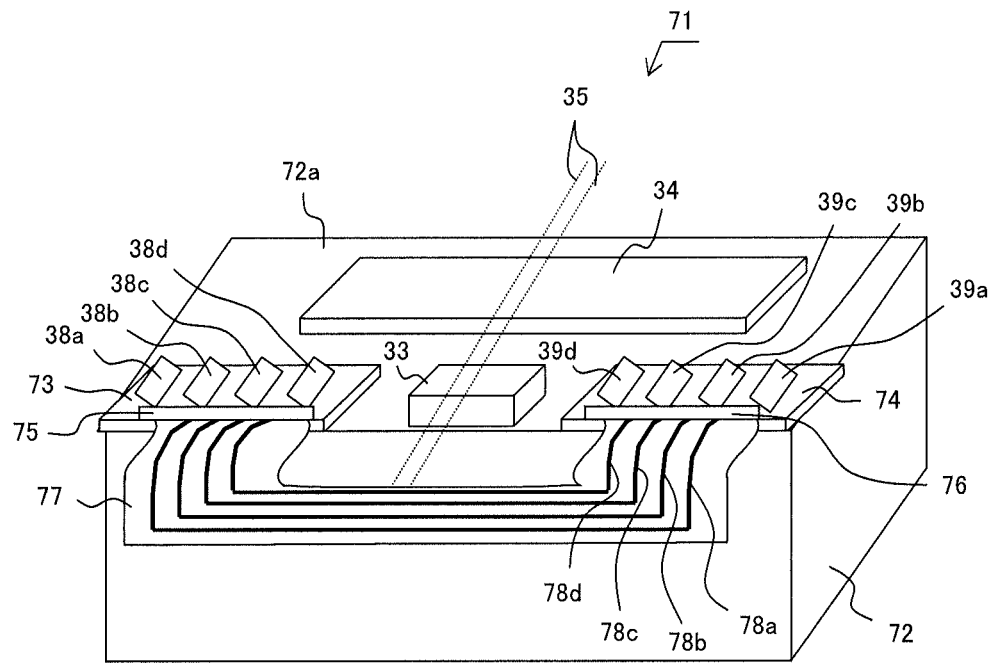
FIG. 10 illustrates the structure of the photoreceiving device according to the fourth embodiment.

FIG. 10 is a schematic diagram of the structure of a photoreceiving device 71 according to the fourth embodiment. One or a plurality of photoreceiving devices 71 are stored in a case, and wire-bonded to the power supply terminal of the case, and then tightly included and used as a photoreceiving device.

The semiconductor chips of the photoreceiving element 33 and the amplifier 34 are the same as those illustrated in FIG. 3. Hereinafter, the same components as in FIG. 3 are assigned the same reference numerals, and the detailed descriptions are omitted here.

In the forth embodiment, the base member 72 is not cut, but the bonding pads 38a through 38d for connection to power supply are electrically connected to the bonding pads 39a through 39d using a flexible cable 77.

The base member 72 corresponds to the base member 32 which is a metal material such as Kovar etc. at both sides of the transmission path 35 of the main signal of a parts arrangement surface 72a at the top surface of the base member 72, a wiring substrate 73 and a wiring substrate 74 are attached by an adhesive etc. The wiring substrates 73 and 74 are insulating substrate such as heat-resistant resin, ceramic, etc.

The bonding pads 38a through 38d for connection to power supply are formed at the top surface of the wiring substrate 73. A connector 75 for connection of the flexible cable 77 is provided at the wiring substrate 73. A wiring pattern for connection of the bonding pads 38a through 38d to the electrode of the connector 75 is also provided at the wiring substrate 73. Otherwise, the bonding pads 38a through 38d can be directly connected to the electrode of the connector 75. The bonding pads 38a through 38d are formed at the wiring substrate 73 by, for example, printing, plating, evaporation, etc.

The bonding pads 39a through 39d for connection to power supply are formed at the top surface of the wiring substrate 74. A connector 76 for connection of the flexible cable 77 is provided at the wiring substrate 74. A wiring pattern for connection of the bonding pads 39a through 39d to the electrode of the connector 76 is also provided at the wiring substrate 74.

The flexible cable (flexible wiring plate) 77 is flexible and heat-resistant resin film, ceramic film, etc., and four conductor patterns 78a through 78d are formed. The conductor patterns 78a through 78d are formed up to both end portions of the flexible cable 77.

The bonding pads 38a through 38d and the bonding pads 39a through 39d can be electrically connected by the conductor patterns 78a through 78d by inserting both end portions of the flexible cable 77 into the connectors 75 and 76 of the wiring substrates 73 and 74. That is, the flexible cable 77 connects the bonding pads 38a through 38d to the bonding pads 39a through 39d at the side of the base member 72, that is, the position other than the parts arrangement surface 72a of the base member 72.

According to the above-mentioned fourth embodiment, for example, when a wiring arrangement is performed between the power supply terminal provided at one side of a case and the power supply terminal provided at both sides of the amplifier 34, the following effect can be acquired. That is, the wiring arrangement between the power supply terminal of a case and the power supply terminal of the side of one (opposite the side at which the power supply terminal of the case is provided) side of the amplifier 34 can be performed using the bonding pads 38a through 38d or 39a through 39d. Thus, it is not necessary to wire a power supply line (wire) across the area above the amplifier 34, thereby shortening the wiring arrangement length of a power supply line. The inductance can also be reduced by shortening the wiring arrangement length of a power supply line. Therefore, the distortion of the waveform of a main signal by the reflection etc. in the power supply line of internal noise of the amplifier 34 can be reduced, and the noise resistance can be improved. In addition, it is not necessary to perform wiring across the area over the amplifier 34, thereby reducing the number of power supply lines passing through the other side (same side as the side at which the power supply terminal of the case is provided) of the amplifier 34, thereby sufficiently reserving the inter-line distance of power supply lines. Thus, the stray capacitances of the power supply lines can be reduced, and the crosstalk of a signal can be reduced.

Furthermore, since the bonding pads 38a through 38d are electrically connected to the bonding pads 39a through 39d by the flexible cable 77, it is not necessary to cut the lower portion of the parts arrangement surface 72a of the base member 32. Thus, the process of cutting the base member 72 is not necessary.

The connection member for connecting the wiring substrate 73 to the wiring substrate 74 is not limited to the flexible cable 77, but any other connection members are available.

FIG. 11 is a schematic diagram of the structure of a photoreceiving device 81 according to the fifth embodiment. In the fifth embodiment, a wiring substrate 82 in which a conductor pattern is formed at the side of the base member 72 is attached, and the bonding pads 38a through 38d are electrically connected to the bonding pads 39a through 39d by the conductor pattern of the wiring substrate 82. In the following descriptions, the same components as in FIGS. 3 and 10 are assigned the same reference numerals, and the detailed descriptions are omitted here.

In FIG. 11, the wiring substrate 82 is attached with an adhesive etc. on the input side (front side as viewed from the front in FIG. 11) of an optical signal of the base member 72.

Connectors 85 and 86 for connection of flexible cables 83 and 84 are attached to the wiring substrate 82. Four conductor patterns 87a through 87d are formed at the wiring substrate 82. One end of the conductor patterns 87a through 87d is connected to the electrode (not illustrated in FIG. 11) of the connector 85, and the other end of the conductor patterns 87a through 87d.

A wiring pattern is formed for the flexible cable 83, the cable is inserted into the connector 75 of the wiring substrate 73 and the connector 85 of the wiring substrate 82, and the connectors are electrically connected to each other. A wiring pattern is also formed for the flexible cable 84, the cable is inserted into the connector 76 of the wiring substrate 74 and the connector 86 of the wiring substrate 82, and the connectors are electrically connected to each other. As a result, the bonding pads 38a through 38d and the bonding pads 39a through 39d are electrically connected by the flexible cables 83 and 84 and the conductor patterns 87a through 87d of the wiring substrate 82.

The connection between the wiring substrates 73 and 74 and the wiring substrate 82 at the side can be made not in the method using the flexible cables 83 and 84 but in other connecting method. For example, the connector 85 of the wiring substrate 82 can be directly connected to the connector 75 of the wiring substrate 73.

According to the above-mentioned fifth embodiment, the effect acquired according to the fourth embodiment can be obtained. That is, the inductance can be reduced by shortening the wiring arrangement length of a power supply line. Thus, the distortion of the waveform of a main signal is reduced, thereby improving the noise resistance. Furthermore, since it is not necessary to perform wiring arrangement across the area over the amplifier 34, the inter-line distance of a power supply line can be sufficiently reserved. Accordingly, the stray capacitances of a power supply line can be reduced, and the crosstalk of a signal can also be reduced.

Furthermore, the bonding pads 38a through 38d can be electrically connected to the bonding pads 39a through 39d by the flexible cables 83 and 84 and the wiring substrate 82. Therefore, the process of cutting a part of the base member 72 is not necessary.

The structures of the above-mentioned fourth and fifth embodiments can also be applied to the photoreceiving device 64 (FIG. 9A) in which two or more photoreceiving element 33 and amplifier 34 are mounted at the base member 65.

When two or more photoreceiving element 33 and amplifier 34 are mounted at the base member 72, two sets of bonding pads 38a through 38d and 39a through 39d provided at both sides of the photoreceiving element 33 are connected through one or two flexible cables 77 illustrated in FIG. 10. Otherwise, they are connected by the wiring substrate 82 and the flexible cables 83 and 84.

In the above-mentioned first through third embodiments, the bonding pads 38a through 38d and the bonding pads 39a through 39d for connection to power supply are arranged at both sides of the photoreceiving element 33, and a part of the base member 32 is cut. However, the present invention is not limited to this structure. For example, when there is no photoreceiving element 33 between the bonding pads 38a through 38d and the bonding pads 39a through 39d for connection to power supply, it is not necessary to provide the convex portion 32b for heat radiation. Therefore, the notch portion 32a of the base member 32 can be rectangular parallelepiped. The photoreceiving device is not limited to the configuration including a plurality of photoreceiving elements 33 and amplifiers 34, but a configuration loaded with other semiconductor chip is available.

According to the disclosed photoreceiving device, the wiring arrangement length of the internal wiring arrangement can be shortened. Thus, the distortion of a signal waveform can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A photoreceiving device, comprising:
    a photoreceiving element that is mounted at a base member;
    an amplifier that is mounted at the base member, and that amplifies output of the photoreceiving element;
    a plurality of first and second bonding pads for connection to power supply arranged at both sides of a transmission path of input or output signal of the photoreceiving element; and
    a connection member that electrically connects the plurality of first bonding pads to the plurality of second bonding pads at a position other than a parts arrangement surface of the base member.

2. The device according to claim 1, wherein
    the connection member has a plurality of sheets as insulating members, a conductor pattern is formed at one surface of the plurality of sheets, the plurality of sheets are laid and inserted into a notch portion of the base member, and the plurality of first bonding pads are electrically connected to the plurality of second bonding pads by the conductor pattern of the plurality of sheets.

3. The device according to claim 1, wherein
    the connection member has a plurality of sheets as insulating members, a conductor pattern is formed over at least one sheet of the plurality of sheets, the plurality of sheets are laid and inserted into a notch portion of the base member, a through hole is formed in the plurality of sheets, and the conductor pattern, the plurality of first bonding pads, and the plurality of second bonding pads are electrically connected.

4. The device according to claim 1, wherein
    the connection member has a plurality of sheets as insulating members, a conductor pattern is formed at two or more sheets of the plurality of sheets, the plurality of sheets are laid and inserted into a notch portion of the base member, a through hole is formed in any sheet of the plurality of sheets, and the conductor pattern, the plurality of first bonding pads, and the plurality of second bonding pads are electrically connected.

5. The device according to claim 1, wherein
    a convex portion for heat radiation is formed at a lower part of the photoreceiving element, the plurality of first and second bonding pads are arranged at both sides of the photoreceiving element, and the connection member is arranged to bypass the convex portion.

6. A photoreceiving device, comprising:
a photoreceiving element that is mounted at a base member;
an amplifier that is mounted at a base member, and that amplifies output of the photoreceiving element;
a first wiring substrate that is arranged at one side of a transmission path of an input or output signal of the photoreceiving element at a parts arrangement surface of the base member, and that has a plurality of first bonding pads formed for connection to power supply;
a second wiring substrate that is arranged at another side of a transmission path of an input or output signal of the photoreceiving element at the parts arrangement surface of the base member, and that has a plurality of second bonding pads formed for connection to power supply; and
a connection member that electrically connects the plurality of first bonding pads of the first wiring substrate to the plurality of second bonding pads of the second wiring substrate.

7. The device according to claim 6, wherein
the connection member has a conductor pattern and a flexible wiring plate, and the plurality of first bonding pads are electrically connected to the plurality of second bonding pads by the conductor pattern of the flexible wiring plate.

8. A photoreceiving device, comprising:
an amplifier that is mounted at a base member, and that amplifies a photoreceiving element and output of the photoreceiving element;
a first wiring substrate that is arranged at one side of a transmission path of an input or output signal of the photoreceiving element at a parts arrangement surface of the base member, and that has a plurality of first bonding pads formed for connection to power supply;
a second wiring substrate that is arranged at another side of a transmission path of an input or output signal of the photoreceiving element at the parts arrangement surface of the base member, and that has a plurality of second bonding pads formed for connection to power supply; and
a third wiring substrate that is attached to a side of the base member, and that has a conductor pattern for electrically connecting the plurality of first bonding pads of the first wiring substrate to the plurality of second bonding pads of the second wiring substrate.

9. The device according to claim 8, comprising
a flexible wiring plate connecting the third substrate, the first substrate, and the second substrate.

10. The device according to claim 9, wherein
one of the plurality of first bonding pads and the plurality of second bonding pads is wire-bonded to a power supply terminal of a case, and another is wire-bonded to a power supply terminal provided at one side of the amplifier.

11. A photoreceiving device, comprising:
first and second amplifiers that amplify first and second photoreceiving elements mounted at a same base member and output of the first and second photoreceiving elements;
a plurality of first and first bonding pads for connection to power supply arranged at both sides of a transmission path of an input or output signal of the first photoreceiving element;
a plurality of third and fourth bonding pads for connection to power supply arranged at both sides of a transmission path of an input or output signal of the second photoreceiving element; and
a connection member that electrically connects the plurality of first bonding pads to the plurality of second bonding pads at a position other than a parts arrangement surface of the base member, and that electrically connects the plurality of third bonding pads to the plurality of fourth bonding pads.

12. The device according to claim 11, wherein
the connection member has a plurality of first and second sheets as insulating members laid and inserted into a notch portion of the base member, a conductor pattern is formed at one of the plurality of first and second sheets, the plurality of first bonding pads are electrically connected to the plurality of second bonding pads by the conductor pattern of the plurality of first sheets, and the plurality of third bonding pads are electrically connected to the plurality of fourth bonding pads by the conductor pattern of the plurality of second sheets.

13. The device according to claim 11, wherein
the connection member has a plurality of sheets as insulating members laid and inserted into a notch portion of the base member, a conductor pattern is formed at one, two, or more sheets in the plurality of sheets, a through hole is formed in any sheet, the conductor pattern of the plurality of sheets, the plurality of first bonding pads, and the plurality of second bonding pads are electrically connected, and the conductor pattern of the plurality of sheets, the plurality of third bonding pads, and the plurality of fourth bonding pads are electrically connected by the through hole.

14. The device according to claim 11, wherein:
the plurality of first and second bonding pads are formed at the first wiring substrate arranged at the parts arrangement surface of the base member;
the third and fourth bonding pads are formed at the second wiring substrate arranged at the parts arrangement surface;
the connection member has a flexible wiring plate at which a conductor pattern is formed, the plurality of first bonding pads are electrically connected to the plurality of second bonding pads by the conductor pattern of the flexible wiring plate, and the plurality of third bonding pads are electrically connected to the plurality of fourth bonding pads.

15. The device according to claim 11, wherein
the connection member is attached to the side of the base member, and comprises a third substrate at which a conductor pattern is formed and a flexible wiring plate connecting the third substrate, the first substrate, and the second substrate.

16. A photoreceiving device comprising:
a first photoreceiving device, comprising:
a first amplifier that amplifies a first photoreceiving element mounted at a first base member and output of the first photoreceiving element;
a plurality of first and second bonding pads for connection to power supply arranged at both sides of a transmission path of an input or output signal of the first photoreceiving element; and
a first connection member that electrically connects the plurality of first bonding pads to the plurality of second bonding pads at a position other than a parts arrangement surface of the first base member; and
a second photoreceiving device, comprising:

a second amplifier that amplifies a second photoreceiving element mounted at into a second base member and output of the second photoreceiving element;

a plurality of third and fourth bonding pads for connection to power supply arranged at both sides of a transmission path of an input or output signal of the second photoreceiving element; and a second connection member that electrically connects the plurality of third bonding pads to the plurality of fourth bonding pads at a position other than a parts arrangement surface of the first base member; and wherein the first photoreceiving device and the second photoreceiving device are enclosed in one case.

17. The device according to claim 16, wherein
the first and second connection members have first and second sheets as insulating members laid and inserted into a notch portion of the base member, a conductor pattern is formed at one surface of each of the plurality of first and second sheets, the conductor pattern of the plurality of first sheets, the plurality of first bonding pads, and the plurality of second bonding pads are electrically connected, the conductor pattern, the plurality of second bonding pads and the plurality of fourth bonding pads are electrically connected.

18. The device according to claim 16, wherein
the first and second connection members have a plurality of sheets as insulating members laid and inserted into a notch portion of the base member, a conductor pattern is formed at one, two, or more sheets in the plurality of sheets, a through hole is formed in any sheet, the conductor pattern, the plurality of first bonding pads, and the plurality of second bonding pads are electrically connected by the through hole, and the conductor pattern, the plurality of third bonding pads, and the plurality of fourth bonding pads are electrically connected.

\* \* \* \* \*